(12) United States Patent  (10) Patent No.: US 8,969,120 B2
Huang et al.  (45) Date of Patent: Mar. 3, 2015

(54) TWO-STAGE PACKAGING METHOD OF IMAGE SENSORS (71) Applicant: Kingpak Technology Inc., Chu-Pei, Hsin-Chu Hsien (TW)

(72) Inventors: Chun-Lung Huang, Hsin-Chu Hsien (TW); Hsiu-Wen Tu, Hsin-Chu Hsien (TW); Cheng-Chang Wu, Hsin-Chu Hsien (TW); Chung-Yu Yang, Hsin-Chu Hsien (TW); Rong-Chang Wang, Hsin-Chu Hsien (TW); Jo-Wei Yang, Hsin-Chu Hsien (TW)

(73) Assignee: Kingpak Technology Inc., Hsin-chu Hsien (TW)

( * ) Notice: Subject to any disclaimer, the term of this patent is extended or adjusted under 35 U.S.C. 154(b) by 0 days.

(21) Appl. No.: 14/053,743

(22) Filed: Oct. 15, 2013

(65) Prior Publication Data

US 2015/0011038 A1    Jan. 8, 2015

(30) Foreign Application Priority Data

Jul. 8, 2013  (TW) .............................. 102124442 A (51) Int. Cl.
| H01L 21/00 | (2006.01) |
| G01R 31/26 | (2014.01) |
| H01L 21/66 | (2006.01) |
| H01L 23/48 | (2006.01) |
| H01L 23/52 | (2006.01) |
| H01L 29/40 | (2006.01) |
| H01L 31/0203 | (2014.01) |

(52) U.S. Cl.
CPC .................................. H01L 31/0203 (2013.01)
USPC ............... 438/64; 438/106; 438/26; 257/777; 257/784

(58) Field of Classification Search
USPC ........ 438/64, 106, 110, 14, 26; 257/680, 681, 257/678, 81, 82, 432–434, 690, 723, 777, 257/781, 784
See application file for complete search history.

(56) References Cited

U.S. PATENT DOCUMENTS

| 6,472,736 | B1 * | 10/2002 | Yeh et al. ....................... 257/686 |
| 6,646,316 | B2 * | 11/2003 | Wu et al. ....................... 257/434 |
| 6,933,493 | B2 * | 8/2005 | Hsin .............................. 250/239 |
| 6,995,462 | B2 * | 2/2006 | Bolken et al. .................. 257/680 |
| 8,481,343 | B2 * | 7/2013 | Hsin et al. ........................ 438/14 |
| 2008/0105941 | A1 * | 5/2008 | Chang et al. .................. 257/433 |
| 2013/0181310 | A1 * | 7/2013 | Jun ................................ 257/432 |
| 2013/0285185 | A1 * | 10/2013 | Park et al. ..................... 257/434 |

* cited by examiner

*Primary Examiner* — Evan Pert
*Assistant Examiner* — Gustavo Ramallo
(74) *Attorney, Agent, or Firm* — Juan Carlos A. Marquez; Bacon & Thomas PLLC (57) ABSTRACT

A two-stage packaging method of image sensors is disclosed. The packaging method includes the following steps: providing a substrate, fixing an image sensor chip on the substrate, fixing a transparent board on the image sensor chip, electrically connecting the image sensor chip and the substrate, forming a first encapsulant lay, and forming a second encapsulant layer. The two-stage packaging method prevents excessive pressure from being generated by formation of the encapsulant layers during the image sensor packaging process. Such excessive pressure, if generated, may result in position shift of the image sensor chip or damage of the bonding wires. The two-stage packaging method can increase the yield of the image sensor packaging process as well as the sensitivity of image sensors, thereby improving the quality and production of image sensor packaging while lowering the manufacturing costs.

11 Claims, 8 Drawing Sheets

TWO-STAGE PACKAGING METHOD OF IMAGE SENSORS

BACKGROUND OF THE INVENTION

1. Technical Field

The present invention relates to a packaging method of image sensors and, more particularly, to a two-stage packaging method of image sensors.

2. Description of Related Art

Conventionally, the packaging of an image sensor involves forming an encapsulant layer on the image sensor chip as well as on the bonding wires that connect the image sensor chip to the substrate, in order to protect both the image sensor chip and the bonding wires, wherein the encapsulant layer is formed by a molding process.

However, during the conventional encapsulant forming process, the pressure resulting from the encapsulant is likely to result in position shift of the image sensor chip or breakage of the bonding wires, and the encapsulant may contaminate the image sensor if passing through the gaps between the image sensor chip and the transparent board serving to protect it. Should the image sensor chip, particularly its sensing area, be contaminated, the functions of the image chip will be affected, and the yield of the image sensor packaging process, reduced.

Therefore, it is important for the semiconductor and image sensor industries to develop an image sensor packaging method which can effectively reduce the molding pressure of the encapsulant.

BRIEF SUMMARY OF THE INVENTION

The present invention discloses a two-stage packaging method of image sensors. The two-stage packaging method prevents excessive pressure from being generated by formation of the encapsulant layers during the image sensor packaging process so that the image sensor chip will not be shifted and the bonding wires which serve the purpose of electrical connection will not be damaged. Hence, the two-stage packaging method can increase the yield of the image sensor packaging process and improve the sensitivity of image sensors thus made.

It is an object of the present invention to provide a two-stage packaging method of image sensors. The two-stage packaging method includes the steps of: providing a substrate having a first surface and a second surface, wherein the second surface faces away from the first surface; fixing an image sensor chip on the substrate, wherein the image sensor chip is fixed on the first surface and has a sensing area; fixing a transparent board on the image sensor chip, wherein the transparent board is connected to the image sensor chip via an intermediate so as to form a sealed space between the transparent board and the image sensor chip, the intermediate surrounding the boundary of the sensing area such that the sensing area is enclosed in the sealed space; electrically connecting the substrate and the image sensor chip, wherein the substrate is electrically connected to the image sensor chip by a plurality of bonding wires, and the bonding wires are located outside the intermediate; forming a first encapsulant layer, wherein a first encapsulant covers the bonding wires, the top surface of the image sensor chip outside the intermediate, and the first surface excluding the area occupied by the image sensor chip, and the first encapsulant is subsequently cured to form the first encapsulant layer, the first encapsulant layer covering a portion of the lateral sides of the transparent board and having a top surface lower than the top surface of the transparent board; and forming a second encapsulant layer, wherein a second encapsulant covers an outer portion of the first encapsulant layer and is subsequently cured to form the second encapsulant layer, the second encapsulant layer covering the remaining portion of the lateral sides of the transparent board and having a top surface as high as and coplanar with the top surface of the transparent board.

The two-stage packaging method of the present invention makes at least two improvements over its prior art counterparts:

1. effectively reducing the impact of the molding pressure of the encapsulant on the image sensor chip and the bonding wires; and
2. increasing the yield, quality, and production of image sensor packaging while reducing manufacturing costs.

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

BRIEF DESCRIPTION OF THE SEVERAL VIEWS OF THE DRAWINGS

The structure as well as a preferred mode of use, further objects, and advantages of the present invention will be best understood by referring to the following detailed description of some illustrative embodiments in conjunction with the accompanying drawings, in which.

DETAILED DESCRIPTION OF THE INVENTION

Figure 1:
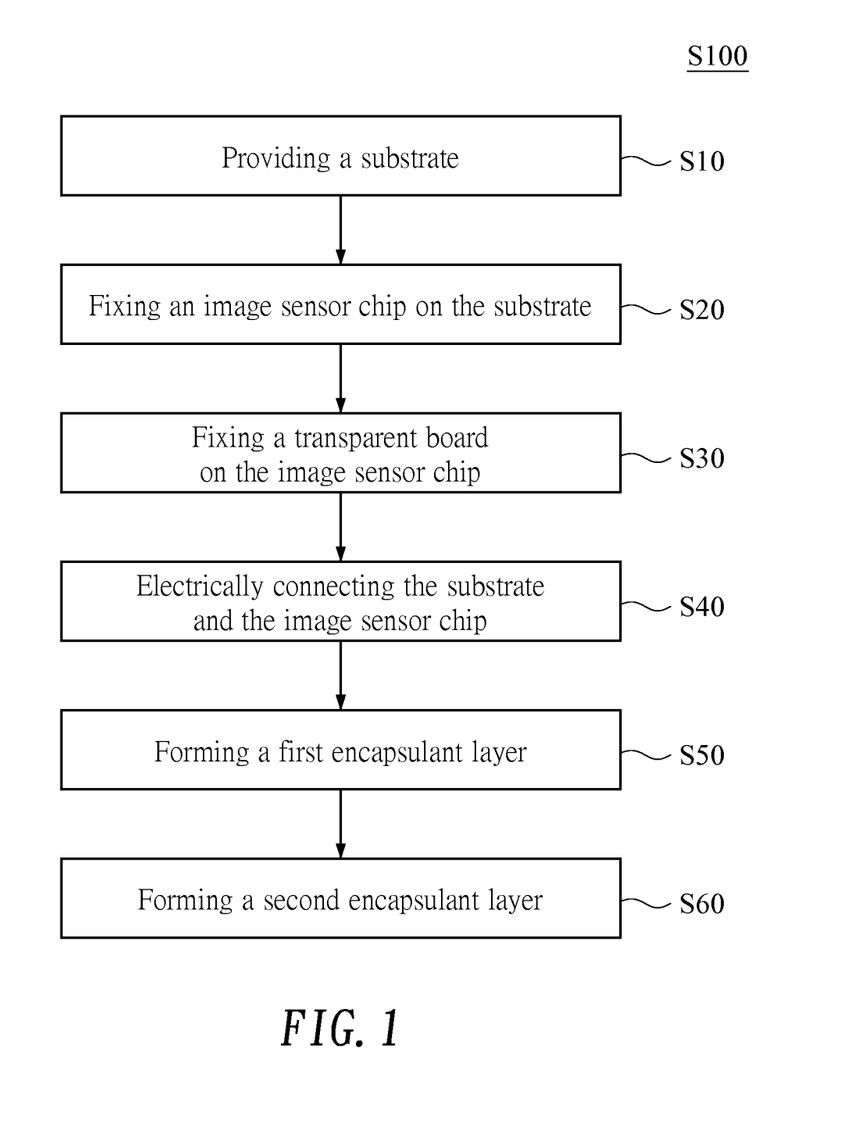
FIG. 1 is a flowchart of steps showing a two-stage packaging method of image sensors according to an embodiment of the present invention.

Referring to FIG. 1 for an embodiment of the present invention, a two-stage packaging method S100 of image sensors includes the steps of: providing a substrate (S10); fixing an image sensor chip on the substrate (S20); fixing a transparent board on the image sensor chip (S30); electrically connecting the image sensor chip and the substrate (S40); forming a first encapsulant layer (S50); and forming a second encapsulant layer (S60).

Referring to FIG. 1, FIG. 2A, FIG. 2F, and FIG. 3, the two-stage packaging method begins by providing a substrate (S10), wherein the substrate 10 has a first surface 11 and a second surface 12, and the second surface 12 faces away from the first surface 11. The substrate 10 is made of plastic or ceramic. The substrate 10 is further provided with a plurality of electrical contacts 13 fixed on the second surface 12. The electrical contacts 13 enable the circuit on the substrate 10 or on the image sensor chip 20 to make electrical connection with components outside the substrate 10.

Referring to FIG. 1, FIG. 2B, FIG. 2F, and FIG. 3, the step of fixing an image sensor chip on the substrate (S20) is carried out as follows. The image sensor chip 20 is fixed on the first surface 11 of the substrate 10. The image sensor chip 20 has a sensing area 21 as an input area for signals sensed by the image sensor chip 20. The image sensor chip 20 is one of a complementary metal-oxide-semiconductor (CMOS) image sensor chip and an integrated circuit having a CMOS image sensor chip.

Referring to FIG. 1, FIG. 2C, FIG. 2F, and FIG. 3, the step of fixing a transparent board on the image sensor chip (S30) involves connecting a transparent board 30 to the image sensor chip 20 via an intermediate 40 so as to form a sealed space 50 between the transparent board 30 and the image sensor chip 20. The intermediate 40 surrounds the boundary of the sensing area 21 such that the sensing area 21 is enclosed in the sealed space 50.

Referring to FIGS. 2C-2F and FIG. 3, the transparent board 30 is formed of one of transparent glass, transparent acrylic, and transparent plastic. A signal sensed by the image sensor chip 20 penetrates the transparent board 30 and is received by the sensing area 21. The intermediate 40 is formed of one of glass, plastic, a polyimide, and an amide resin, or the intermediate 40 is formed by molding a liquid crystal polymer (LCP). If the intermediate 40 is formed of any of the foregoing materials, the upper end and the lower end of the intermediate 40 can be tightly connected, through an adhesive 41, to the transparent board 30 and the image sensor chip 20 respectively.

Figure 3:
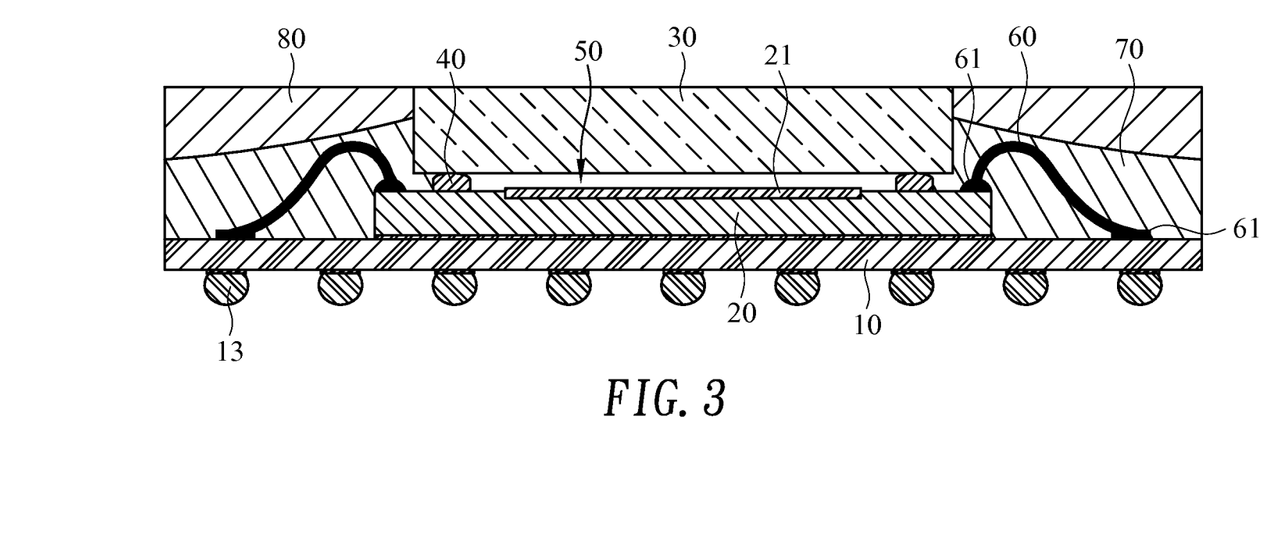
FIG. 3 is a cross-sectional view showing another image sensor package formed by the two-stage packaging method of image sensors according to an embodiment of the present invention.

As shown in FIG. 3, the intermediate 40 may alternatively be one of a heat-curable adhesive, a UV-curable adhesive, an adhesive polyimide, and an adhesive amide resin. In that case, the transparent board 30 can be adhered to the image sensor chip 20 through the curing process of the intermediate 40. If the intermediate 40 is one of a heat-curable adhesive and a UV-curable adhesive, the intermediate 40 and the image sensor chip 20 can be tightly connected without application of the adhesive 41.

Figure 2A:
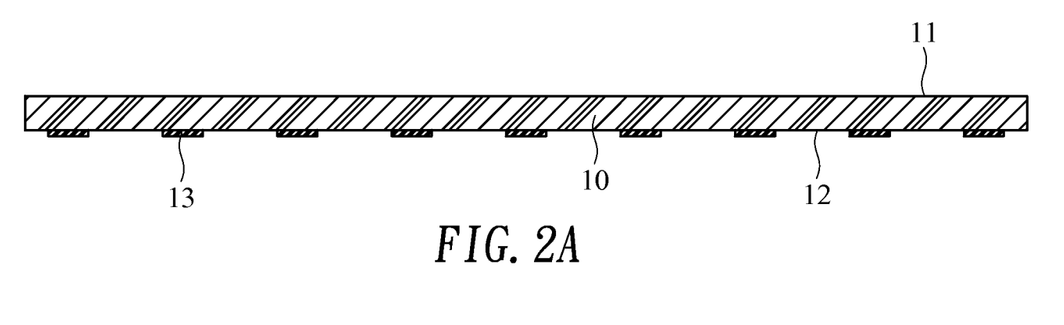
FIG. 2A is a cross-sectional view showing a substrate according to an embodiment of the present invention.
Figure 2B:
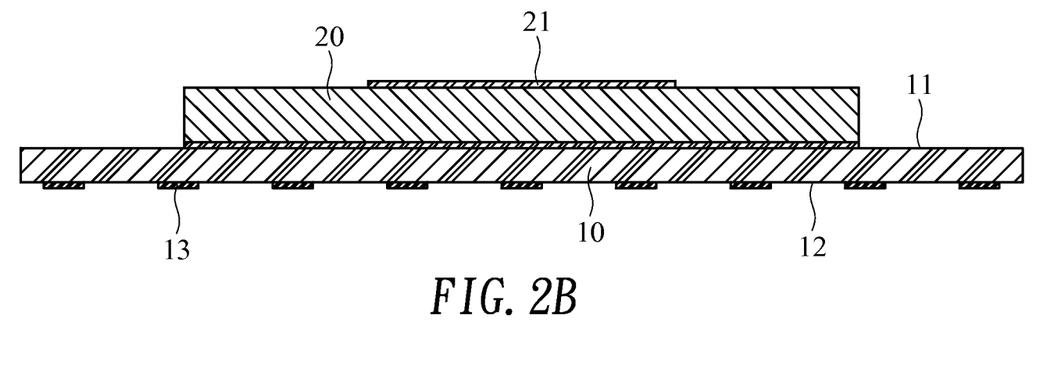
FIG. 2B is a cross-sectional view showing how an image sensor chip is fixed on the substrate according to an embodiment of the present invention.
Figure 2C:
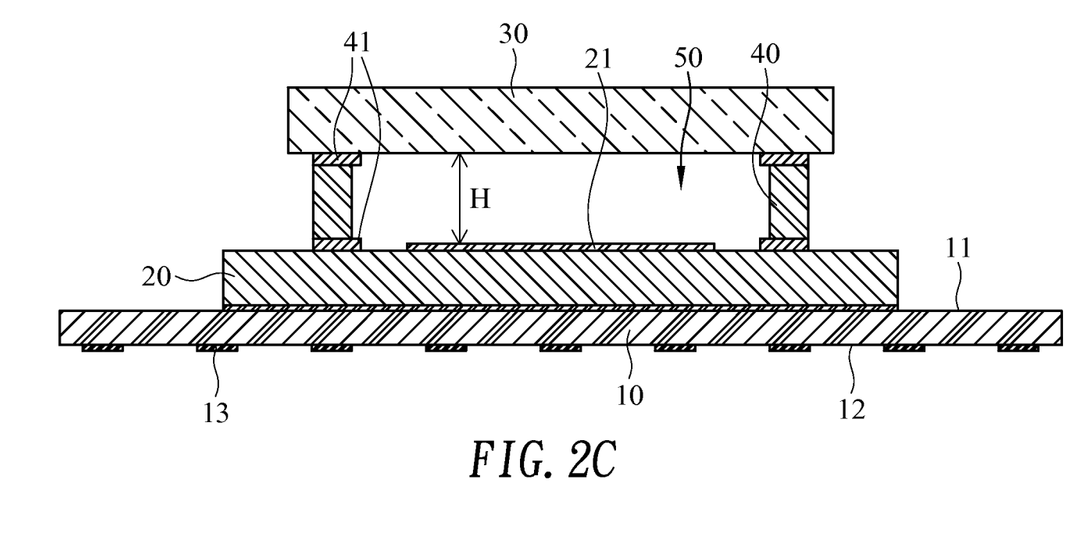
FIG. 2C is a cross-sectional view showing how a transparent board is fixed on the structure depicted in FIG. 2B according to an embodiment of the present invention.
Figure 2D:
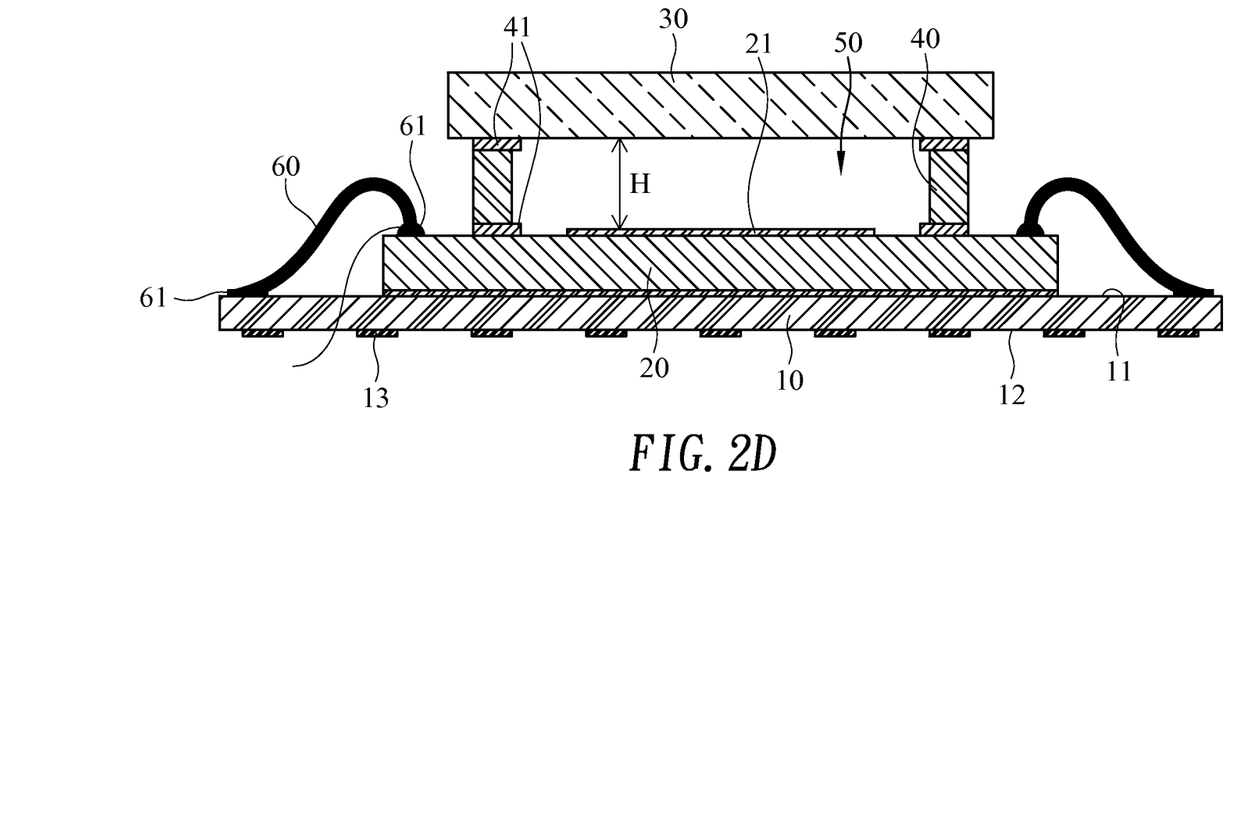
FIG. 2D is a cross-sectional view showing how electrical connection is made between the image sensor chip and the substrate of the structure depicted in FIG. 2C.
Figure 2E:
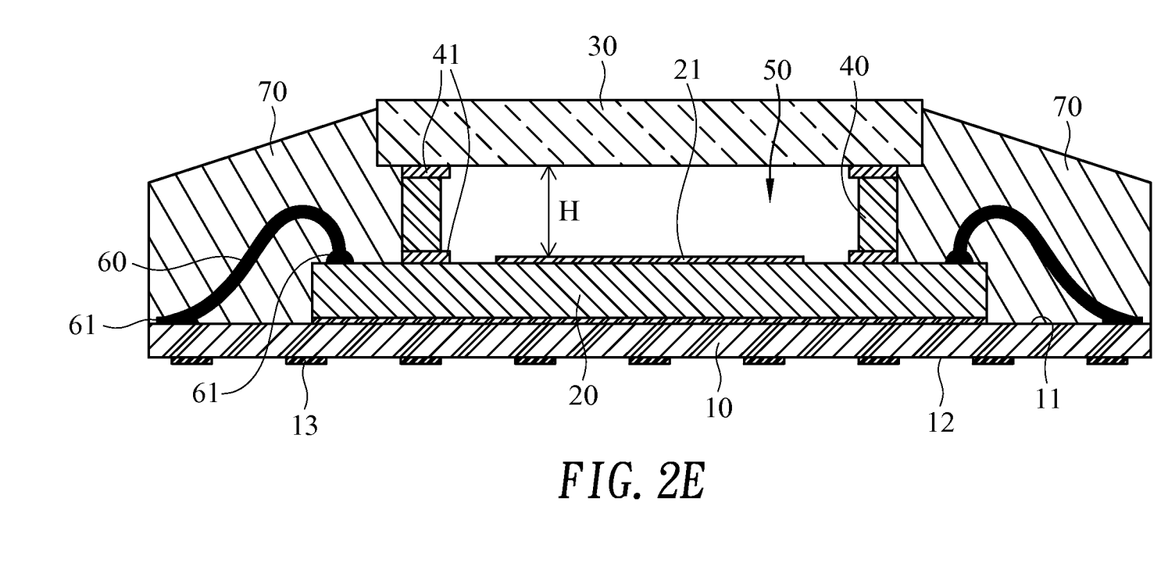
FIG. 2E is a cross-sectional view showing how a first encapsulant layer is formed on the structure depicted in FIG. 2D.
Figure 2F:
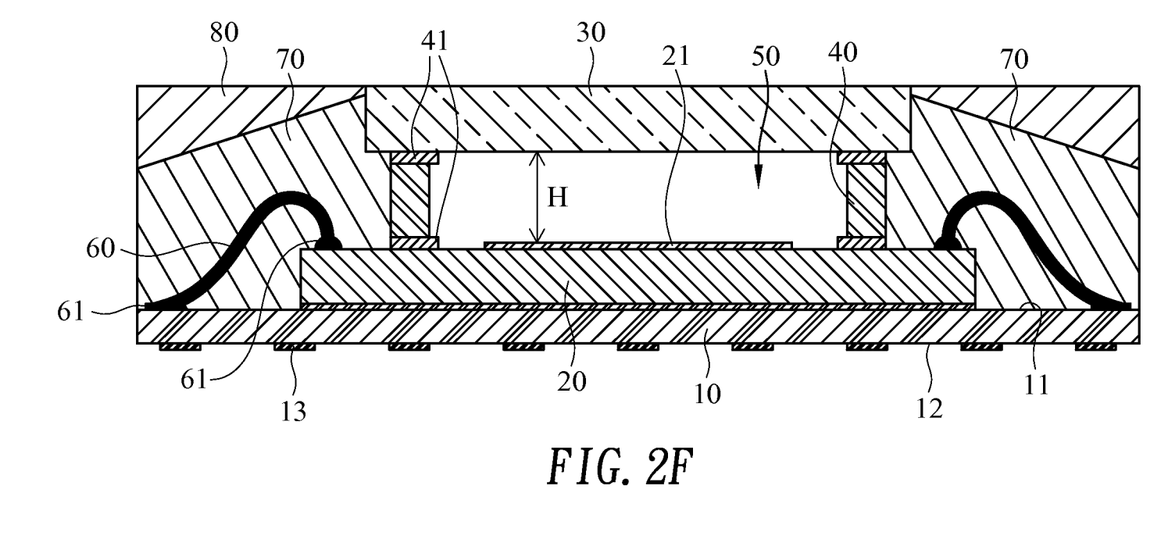
FIG. 2F is a cross-sectional view showing how a second encapsulant layer is formed on the structure depicted in FIG. 2E, thus the cross-sectional view also showing an image sensor package formed by the two-stage packaging method of image sensors according to an embodiment of the present invention.

Referring to FIG. 2C, FIG. 2F, and FIG. 3, the height H of the sealed space 50 formed by the intermediate 40, the transparent board 30, and the image sensor chip 20 is the vertical distance between the transparent 30 and the image sensor chip 20. The height H of the sealed space 50 can be determined according to the sensing requirement of the image sensor chip 20 and be achieved by selecting an intermediate 40 of the appropriate size in the step of fixing a transparent board on the image sensor chip (S30).

Referring to FIG. 2C and FIG. 2F, the height H of the sealed space 50 may range from 100 um to 500 um (um=micro meter; i.e., $10^{-6}$ meter).

Reference is now made to FIG. 1, FIG. 2D, FIG. 2F, and FIG. 3. To perform the step of electrically connecting the substrate and the image sensor chip (S40), the two connecting ends 61 of each of a plurality of bonding wires 60 are respectively connected to the substrate 10 and the image sensor chip 20 so as to electrically connect the substrate 10 and the image sensor chip 20. The bonding wires 60 and the connecting ends 61 are located outside the intermediate 40; that is to say, the bonding wires 60 and the connecting ends 61 are located outside the sealed space 50. The bonding wires 60 are electric wires made of gold (Au), a mixture of gold and silver (Ag), or a mixture of gold and copper (Cu).

Referring to FIG. 1, FIG. 2E, FIG. 2F, and FIG. 3, the step of forming a first encapsulant layer (S50) is executed in the following manner. A first encapsulant covers the bonding wires 60, the connecting ends 61, the top surface of the image sensor chip 20 outside the intermediate 40, and the first surface 11 excluding the area occupied by the image sensor chip 20. The first encapsulant is then cured to form a first encapsulant layer 70, wherein the first encapsulant layer 70 covers a portion of the lateral sides of the transparent board 30 and has a top surface lower than the top surface of the transparent board 30.

The first encapsulant may be an epoxy. The first encapsulant is applied by a dispensing process such that the first encapsulant covers the bonding wires 60, the connecting ends 61 at both ends of each bonding wire 60, the top surface of the image sensor chip 20 outside the intermediate 40, and the first surface 11 excluding the area occupied by the image sensor chip 20. As the first encapsulant maintains a liquid and gluey substance during its application, and the epoxy is not required to be of the same height as the transparent board 30, the pressure resulting from the first encapsulant is relatively low, and because of the fluid property, the impact of the pressure on the bonding wires 60, the two connecting ends 61 of each bonding wire 60, or the image sensor chip 20 is relatively small. After the first encapsulant is cured and forms the first encapsulant layer 70, all the components in first encapsulant layer 70 are protected, wherein the components refer to the bonding wires 60, the connecting ends 61 of each bonding wire 60, the top surface of the image sensor chip 20 outside the intermediate 40, and the first surface 11 excluding the area occupied by the image sensor chip 20.

Refer again to FIG. 1, FIG. 2F, and FIG. 3. To perform the step of forming a second encapsulant layer (S60), a second encapsulant is used to cover an outer portion of the first encapsulant layer 70. The second encapsulant is then cured to form a second encapsulant layer 80, wherein the second encapsulant layer 80 covers the remaining portion of the lateral sides of the transparent board 30. Moreover, the top surface of the second encapsulant layer 80 is as high as and coplanar with the top surface of transparent board 30.

Referring to FIG. 2E, FIG. 2F, and FIG. 3, the lateral sides of the first encapsulant layer 70 and the lateral sides of second encapsulant layer 80 are made flush with the lateral sides of the substrate 10.

As the second encapsulant covers the aforesaid outer portion of the first encapsulant layer 70 only after the first encapsulant is cured and forms the first encapsulant layer 70, the components covered and protected by the first encapsulant layer 70 will not be affected by the pressure resulting from the step of forming a second encapsulant layer (S60).

The second encapsulant may be a heat-curable encapsulant and may vary in material or color depending on application requirements. When implementing the two-stage packaging method S100 of image sensors, the second encapsulant may be a black or opaque material in order not to interfere with sensing.

In the two-stage packaging method S100 of image sensors, the two-stage formation of the first encapsulant layer 70 and the second encapsulant layer 80 greatly reduces the adverse effects of the encapsulant forming pressure on the bonding wires 60 or the image sensor chip 20. Consequently, not only can the yield, quality, and production of the image sensor packaging process be increased, but also the manufacturing costs can be lowered.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A two-stage packaging method of image sensors, comprising the steps of:
    providing a substrate, the substrate having a first surface and a second surface, the second surface facing away from the first surface;
    fixing an image sensor chip on the substrate, the image sensor chip being fixed on the first surface of the substrate and having a sensing area;
    fixing a transparent board on the image sensor chip, the transparent board being connected to the image sensor chip via an intermediate so as to form a sealed space between the transparent board and the image sensor chip, the intermediate surrounding a boundary of the sensing area such that the sensing area is enclosed in the sealed space;
    electrically connecting the substrate and the image sensor chip, the substrate being electrically connected to the image sensor chip by a plurality of bonding wires, the bonding wires being located outside of the intermediate;
    forming a first encapsulant layer, wherein the first encapsulant layer is formed by covering the bonding wires, a top surface of the image sensor chip outside the intermediate, and the first surface excluding an area occupied by the image sensor chip, with a first encapsulant, and curing the first encapsulant to form the first encapsulant layer, wherein the first encapsulant layer covers a portion of lateral sides of the transparent board and has a top surface lower than a top surface of the transparent board; and
    forming a second encapsulant layer, wherein the second encapsulant layer is formed by covering an outer portion of the first encapsulant layer with a second encapsulant and curing the second encapsulant to form the second encapsulant layer, wherein the second encapsulant layer covers a remaining portion of the lateral sides of the transparent board and has a top surface as high as and coplanar with the top surface of the transparent board.

2. The two-stage packaging method of claim 1, wherein the substrate is made of plastic or ceramic and is provided with a plurality of electrical contacts fixed on the second surface.

3. The two-stage packaging method of claim 1, wherein the image sensor chip is one of a complementary metal-oxide-semiconductor (CMOS) image sensor chip and an integrated circuit having a CMOS image sensor chip.

4. The two-stage packaging method of claim 1, wherein the intermediate is made of glass or plastic, and an upper end and a lower end of the intermediate are tightly connected, through an adhesive, to the transparent board and the image sensor chip respectively.

5. The two-stage packaging method of claim 1, wherein the intermediate is formed by molding a liquid crystal polymer (LCP), and an upper end and a lower end of the intermediate are tightly connected, through an adhesive, to the transparent board and the image sensor chip respectively.

6. The two-stage packaging method of claim 1, wherein the intermediate is one of a heat-curable adhesive, a UV-curable adhesive, an adhesive polyimide, and an adhesive amide resin, and the transparent board is adhered to the image sensor chip through a curing process of the intermediate.

7. The two-stage packaging method of claim 4, wherein the sealed space has a height ranging from 100 um to 500 um.

8. The two-stage packaging method of claim 5, wherein the sealed space has a height ranging from 100 um to 500 um.

9. The two-stage packaging method of claim 6, wherein the sealed space has a height ranging from 100 um to 500 um.

10. The two-stage packaging method of claim 1, wherein the first encapsulant is an epoxy.

11. The two-stage packaging method of claim 1, where the second encapsulant is a heat curable encapsulant.

* * * * *